(12) United States Patent
Kang et al.

(10) Patent No.: US 9,824,788 B2
(45) Date of Patent: Nov. 21, 2017

(54) METAL WIRE HAVING A COPPER LAYER AND A BARRIER LAYER AND DISPLAY DEVICE INCLUDING THE SAME

(71) Applicant: SAMSUNG DISPLAY CO., LTD., Yongin, Gyeonggi-Do (KR)

(72) Inventors: Su Hyoung Kang, Gyeonggi-do (KR); Sang Woo Sohn, Gyeonggi-do (KR); Chang Oh Jeong, Gyeonggi-do (KR); Gwang Min Cha, Chungcheongbuk-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/659,730

(22) Filed: Mar. 17, 2015

(65) Prior Publication Data

US 2016/0133348 A1 May 12, 2016

(30) Foreign Application Priority Data

Nov. 11, 2014 (KR) .................. 10-2014-0156230

(51) Int. Cl.
| | |
|---|---|
| H01B 1/02 | (2006.01) |
| H01L 33/44 | (2010.01) |
| H01L 33/62 | (2010.01) |
| H01B 5/02 | (2006.01) |
| H01L 27/32 | (2006.01) |

(52) U.S. Cl.
CPC .......... *H01B 1/026* (2013.01); *H01L 27/3276* (2013.01)

(58) Field of Classification Search
CPC ........... H01B 1/026; H01B 5/02; H01L 33/44; H01L 33/62

USPC ........ 257/43, 66, 59, 99; 438/30, 48; 349/43
See application file for complete search history.

(56) References Cited

U.S. PATENT DOCUMENTS

| | | | | |
|---|---|---|---|---|
| 4,929,512 A | * | 5/1990 | Nishimura ............ | B32B 15/013 428/610 |
| 5,304,428 A | * | 4/1994 | Takami .................... | C25D 3/58 428/607 |
| 5,916,695 A | * | 6/1999 | Fister ...................... | B32B 15/01 428/646 |
| 2005/0079685 A1 | | 4/2005 | Ramanathan et al. | |
| 2005/0098440 A1 | | 5/2005 | Kailasam et al. | |
| 2006/0134449 A1 | * | 6/2006 | Sigler .................. | B23K 9/0026 428/621 |
| 2008/0179296 A1 | * | 7/2008 | Ly ........................... | B23H 7/08 219/69.12 |
| 2011/0228502 A1 | * | 9/2011 | Chen ..................... | C23C 14/165 361/777 |
| 2012/0295438 A1 | | 11/2012 | Koike et al. | |
| 2013/0178010 A1 | * | 7/2013 | Kim .......................... | C23F 1/18 438/73 |

(Continued)

FOREIGN PATENT DOCUMENTS

| | | |
|---|---|---|
| KR | 1020130086910 | 8/2013 |
| KR | 1020130133083 | 12/2013 |

*Primary Examiner* — Trung Q Dang
*Assistant Examiner* — Didarul Mazumder
(74) *Attorney, Agent, or Firm* — F. Chau & Associates, LLC

(57) ABSTRACT

Provided is a metal wire. The metal wire includes a copper layer, and at least one barrier layer. The barrier layer is disposed on at least one of an upper part and a lower part of the copper layer. The barrier layer includes an alloy including copper, nickel, and zinc.

14 Claims, 9 Drawing Sheets

(56) References Cited

U.S. PATENT DOCUMENTS

2013/0200382 A1* 8/2013 Kim .................. H01L 29/45
                                                257/59
2014/0091306 A1   4/2014 Miki et al.
2015/0179508 A1* 6/2015 Adhiprakasha ... H01L 21/76832
                                                257/751

* cited by examiner

METAL WIRE HAVING A COPPER LAYER AND A BARRIER LAYER AND DISPLAY DEVICE INCLUDING THE SAME

CROSS-REFERENCE TO RELATED APPLICATION

This application claims priority under 35 U.S.C. §119 to Korean Patent Application No. 10-2014-0156230 filed on Nov. 11, 2014 in the Korean Intellectual Property Office, the disclosure of which is incorporated by reference herein in its entirety.

TECHNICAL FIELD

Exemplary embodiments of the present invention relate to a display device, and more particularly to a metal wire and a display device including the same.

DISCUSSION OF RELATED ART

Generally, a display substrate, which may be used in a display device, includes a thin film transistor as a switching device for operating each pixel area. Generally, display substrates include a signal wire and a pixel electrode connected to the signal wire.

As the size of display devices increase, a length of the signal wire may increase. As such, the width of the signal wire may be reduced as the length of the signal wire increases, and thus the resistance in the signal wire may increase.

Therefore, copper, which is a low resistance metal, may be included in the metal wire.

SUMMARY

Exemplary embodiments of the present invention provide a metal wire having low resistance and a display device including the same.

According to an exemplary embodiment of the present invention, a metal wire includes a copper layer; and at least one barrier layer. The barrier layer is disposed on at least one of an upper part and a lower part of the copper layer. The barrier layer includes an alloy including copper, nickel, and zinc.

The barrier layer may include a first barrier layer which is disposed on the lower part of the copper layer.

The first barrier layer may include copper at 20 weight % to 60 weight %, nickel at 20 weight % to 40 weight %, and zinc at 20 weight % to 40 weight %.

The thickness of the first barrier layer may be from 50 Å to 600 Å.

The barrier layer may include a second barrier which is disposed on the upper part of the copper layer.

The second barrier may include copper at 20 weight % to 40 weight %, nickel at 20 weight % to 40 weight %, and zinc at 20 weight % to 60 weight %.

The thickness of the second barrier may be from 50 Å to 600 Å.

According to an exemplary embodiment of the present invention, the barrier layer may include a first barrier layer which is disposed on the lower part of the copper layer. A second barrier layer may be disposed on the upper part of the copper layer. The zinc content of the second barrier layer may be higher than the zinc content of the first barrier.

The copper layer may have a thickness of from 2500 Å and 3500 Å.

The metal wire may include a taper angle of from 300 to 60°.

The metal wire may be etched with a non-$H_2O_2$-based etchant.

The upper skew of the metal wire may be 800 nm or less.

The lower skew of the metal wire may be 250 nm or less.

The sheet resistance of the metal wire before heat treatment may be from 0.064 ohm/sq. to 0.068 ohm/sq.

The sheet resistance of the metal wire after heat treatment may be from 0.15 ohm/sq. to 0.25 ohm/sq.

According to an exemplary embodiment of the present invention, a display device includes a thin film transistor disposed in an area where a gate wire and a data wire cross each other. A semiconductor layer is disposed on the thin film transistor. An insulating layer is configured to insulate the gate wire and the data wire. A pixel electrode is connected to the data wire. The gate wire and the data wire include a copper layer and a barrier layer. The barrier layer is disposed on at least one of the upper part and the lower part of the copper layer. The barrier layer includes copper, nickel, and zinc.

The barrier layer may include a first barrier layer disposed on the lower part of the copper layer; and a second barrier layer disposed on the upper part of the copper layer.

The first barrier layer may include copper at 20 weight % to 60 weight %, nickel at 20 weight % to 40 weight %, and zinc at 20 weight % to 40 weight %.

The second barrier layer may include copper at 20 weight % to 40 weight %, nickel at 20 weight % to 40 weight %, and zinc at 20 weight % to 60 weight %.

The semiconductor layer or the pixel electrode may include a material including oxygen elements.

BRIEF DESCRIPTION OF THE DRAWINGS

The above and other features and aspects of the present invention will become more apparent by describing in detail preferred embodiments thereof with reference to the accompanying drawings, in which.

DETAILED DESCRIPTION OF THE EMBODIMENTS

Figure 1A:
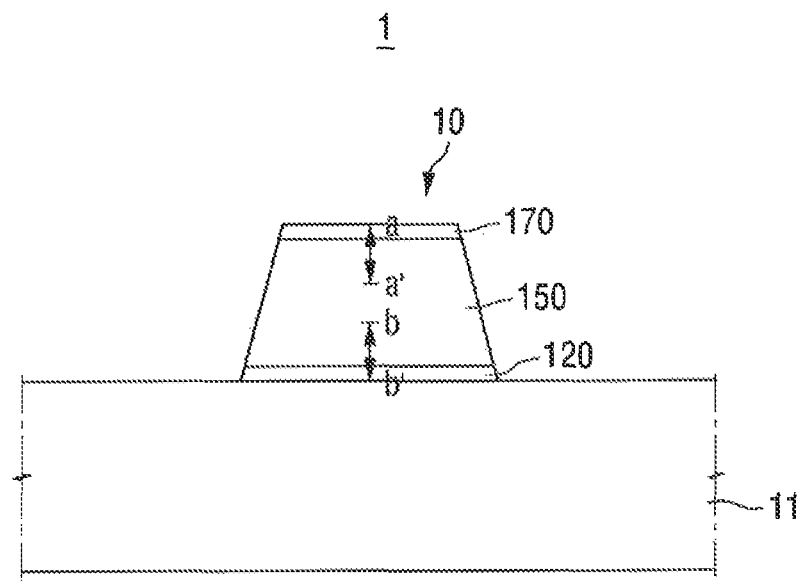
FIGS. 1A to 1C are cross-sectional views illustrating a metal wire structure including a metal wire according to an exemplary embodiment of the present invention.

Exemplary embodiments of the present invention and methods of accomplishing the same may be understood more fully by reference to the following detailed description of exemplary embodiments of the present invention and the accompanying drawings. The present invention may, however, be embodied in many different forms and should not be construed as being limited to the exemplary embodiments set forth herein.

In the drawings, the size and thickness of each element may be illustrated for descriptive purposes, and the present invention is not necessarily limited thereto.

Hereinafter, exemplary embodiments of the present invention will be described in more detail with reference to the accompanying drawings.

Figure 1B:
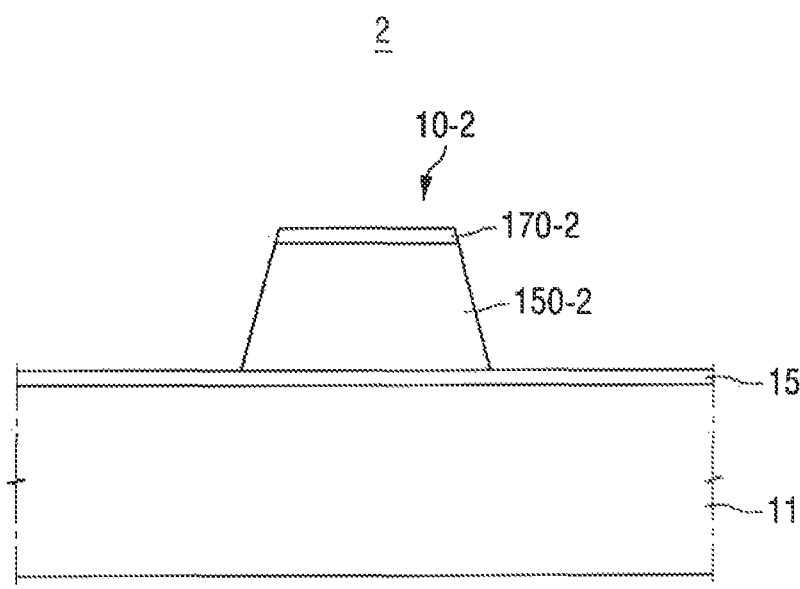
Figure 1C:
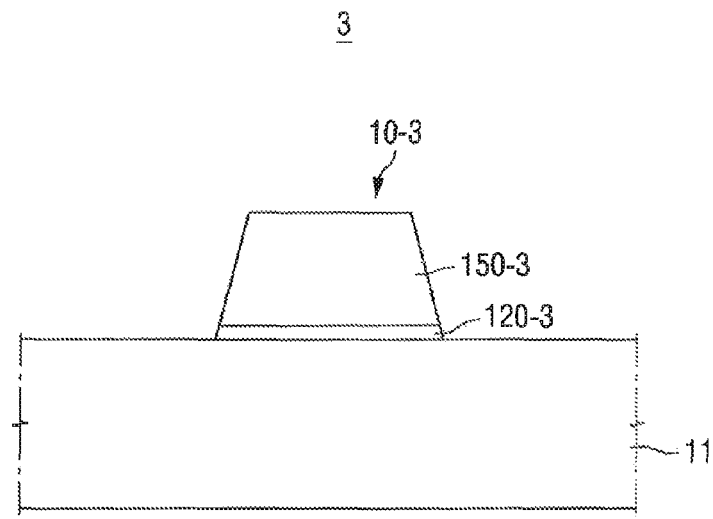
Figure 2A:
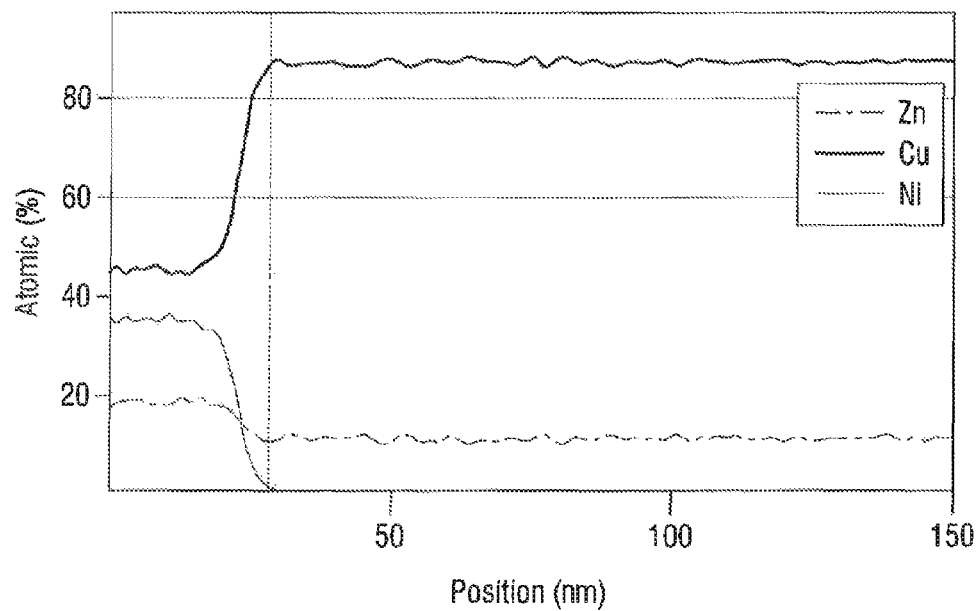
FIG. 2A is a graph illustrating elements of a metal wire according to line a-a' of FIG. 1A.
Figure 2B:
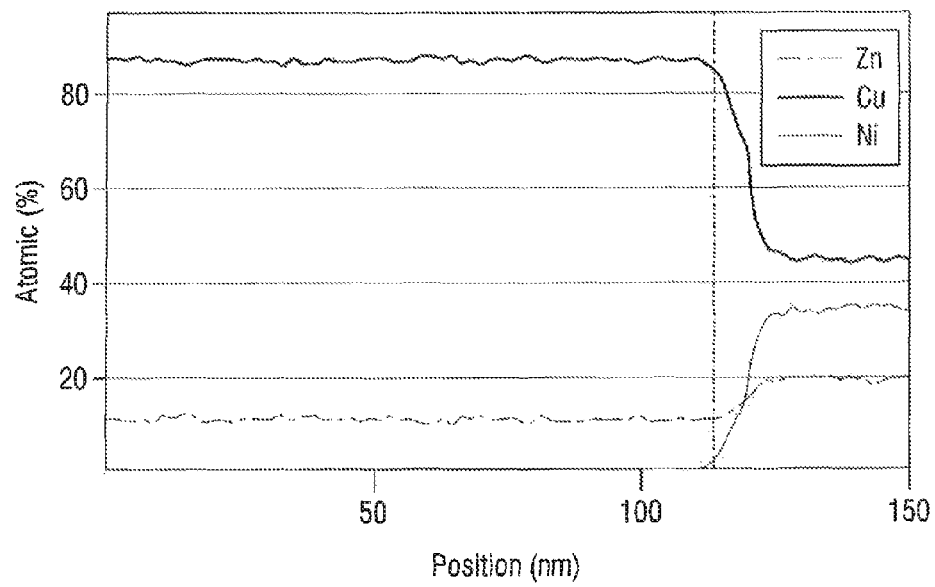
FIG. 2B is a graph illustrating elements of a metal wire according to line b-b' of FIG. 1A.

FIGS. 1A to 1C are cross-sectional views illustrating a metal wire structure including a metal wire according to an exemplary embodiment of the present invention, FIG. 2A is a graph illustrating elements of a metal wire according to line a-a' of FIG. 1A, and FIG. 2B is a graph illustrating elements of a metal wire according to line b-b' of FIG. 1A.

Referring to FIGS. 1A to 1C, a metal wire structure 1 according to an exemplary embodiment of the present invention may include a substrate 11 and metal wires 10, 10-2, and/or 10-3 disposed on the substrate 11. The metal wires 10, 10-2, and/or 10-3 may be used as a gate wire or a data wire of a display device. The display device will be described in more detail below.

Glass, quartz, silicon, sapphire, and/or a polymer including plastic may be included in the substrate 11. The metal wires 10, 10-2, and 10-3 may be patterned wires disposed on the substrate 11. The metal wires 10, 10-2, and 10-3 may include two or three layers.

The metal wires 10, 10-2, and 10-3 may include a copper layer 150, and first and second barrier layers 120 and 170. The first and second barrier layers 120 and 170 may be disposed on at least one of the upper part and the lower part of the copper layer 150. The first and second barrier layers 120 and 170 may include an alloy. The alloy may include copper, nickel, and/or zinc. In the copper wires 10, 10-2, and 10-3, the copper layer may be disposed on the substrate 11. An insulating layer may be disposed on the copper layer 150. One or more of the first and second barrier layers 120 and 150 may be disposed between the substrate 11 and the copper layer 150 and between the insulating layer and the copper layer 150.

Referring to FIG. 1A, the metal wire 10 may include the first barrier layer 120, the second barrier layer 170, and the copper layer 150. The copper layer 150 may be disposed between the first barrier layer 120 and the second barrier layer 170.

The copper layer 150 may include copper Cu or a copper alloy. The copper layer 150 may have a thickness of from 2500 Å to 3500 Å. If the thickness of the copper layer 150 is less than 2500 Å, as the metal wire is lengthened, the resistance of the metal wire 10 may increase. If the thickness of the copper layer 150 is greater than 3500 Å, implementing minute patterns may be difficult because a critical dimension may decrease at the time of etching. For example, a taper angle of a profile of a pattern, which is obtained by etching the copper layer 150, of which the thickness is between about 2500 Å and about 3500 Å, may be increased, and an occurrence of an etching error may be reduced.

The first barrier layer 120 may be disposed between the copper layer 150 and the substrate 11. If the substrate 11 includes silicon glass including silicon elements, the copper elements, which are included in the copper layer 150, may have weak adhesiveness with the substrate 11, and the diffusion rate between the silicon and other materials of the substrate 11 may be relatively high.

The diffusion between the materials of the substrate and the copper layer 150 may increase the resistance of the copper layer 150. Thus, the first barrier layer 120 may be a barrier for preventing the diffusion between the substrate 11 and the copper layer 150. The first barrier layer 120 may increase adhesion between the substrate 11 and the copper layer 150.

The second barrier layer 170 may be disposed on the copper layer 150. The insulating layer for insulating the metal wire 10 may be formed on the metal wire 10 after arranging the metal wire 10 on the substrate 11. The second barrier layer 170 may be in contact with or may be attached to the insulating layer. The second barrier layer 170 may be a capping layer. The capping layer may prevent diffusion between the insulating layer and other materials. Thus, the first barrier layer 120 and the second barrier layer 170 may be respectively disposed on the lower part and the upper part of the copper layer 150.

The first barrier layer 120 and the second barrier layer 170 may each have a thickness of from about 50 Å to about 600 Å. If the thickness of the first and second barrier layers 120 and 170 is greater than 600 Å, the resistance of the metal wire 10 may be increased. If the thickness of the first and second barrier layers 120 and 170 is less than 50 Å, the layer may be too thin to operate as a barrier layer, and thus the other materials may move over the barrier layer so that the other materials may be diffused.

According to an exemplary embodiment of the present invention, referring to FIG. 1B, a metal structure 2 may include the metal wire 10-2 disposed on the substrate 11. The metal wire 10-2 may include a buffer layer 15 disposed between the substrate 11 and a copper layer 150-2. The buffer layer 15 may prevent the flow of impurities of the substrate 11 into the copper layer 150-2. The buffer layer 15 may form a flat plane.

According to an exemplary embodiment of the present invention, in the metal wire structure 2, the first barrier layer 120 may be omitted. The copper layer 150-2 may be disposed on the buffer layer 150 disposed on the substrate 11. The buffer layer 150 may include materials in which the diffusion between the copper layer 150-2 and other materials does not occur. Thus, the first barrier layer 120 may be omitted, and the copper layer 150-2 and a second barrier layer 170-2 may be disposed on the substrate 11.

The copper layer 150-2 may be disposed on the substrate 11. When diffusion occurs between the copper layer 150-2 and other materials, particular materials having a predetermined peel strength with the copper layer 150-2 may be used, and the metal wire 10-2 may be disposed on the substrate 11.

According to an exemplary embodiment of the present invention, referring to FIG. 1C, a metal wire structure 3 may include the metal wire 10-3 disposed on the substrate 11. In the metal wire 10-3, a first barrier layer 120-3 may be disposed between the substrate 11 and a copper layer 150-3. The second barrier layer 170 may be omitted from the upper part of the copper layer 150-3.

The metal wire 10-3 may be disposed on the substrate 11, and the insulating layer, which may insulate the metal wire 10-3, may be disposed on the metal wire 10-3. The insulating layer may be in contact with or may be attached to the copper layer 150-3. The peel strength of the insulating layer and the copper layer 150-3 may be different depending on the materials included in the insulating layer and the copper layer 150-3. Thus, when the peel strength between the insulating layer and the copper layer 150-3 is relatively high, the second barrier layer 170 may be omitted, and the insulating layer may be disposed on the metal wire 10-3.

When the insulating layer has material characteristics in which diffusion between the copper layer 150-3 and other materials does not occur, the metal wire 10-3 may be disposed on the substrate 11 with the insulating layer disposed on the copper layer 150-3. As such, the second barrier layer 170 may be omitted according to the material characteristics of the insulating layer which may be attached on the copper layer 150-3.

By selectively arranging the first barrier layers 120 and 120-3 and the second barrier layers 170 and 170-2 on the copper layers 150, 150-2, and 150-3, the electrical conductivity of the metal wires 10, 10-2, and 10-3 may be increased and the adhesive characteristics of the metal wires 10, 10-2, and 10-3 may be increased.

Referring to FIGS. 2A and 2B, the first and second barrier layers 120 and 170, which may be selectively disposed on the upper part and the lower part of the copper layer 150 in the metal wire 10, may include an alloy including copper (Cu), nickel (Ni), and/or zinc (Zn). FIG. 1A may be referred to as a representative example according to an exemplary embodiment of the present invention.

According to an exemplary embodiment of the present invention, referring to FIG. 2A, the second barrier 170 may include copper at 47 weight %, nickel at 33 weight %, and zinc at 20 weight %. According to an exemplary embodiment of the present invention, referring to FIG. 2B, the first barrier layer 120 may include copper at 47 weight %, nickel at 33 weight %, and zinc at 20 weight %.

According to an exemplary embodiment of the present invention, the first barrier layer 120 may include copper at 40 weight %, nickel at 40 weight %, and zinc at 20 weight %, and the second barrier layer 170 may include copper at 20 weight %, nickel at 40 weight %, and zinc at 40 weight %.

The Cu:Ni:Zn content of the first and second barrier layers 120 and 170 is not limited to the embodiments described herein, and the Cu:Ni:Zn content may be determined, as desired. The second barrier layer 170 may have a higher Zn content than the first barrier layer 120.

Atomic radiuses of copper (Cu), nickel (Ni), and zinc (Zn) elements included in the first and second barrier layers 120 and 170, may be similar to each other, and thus a space, in which atoms may invade the copper layer 150, need not exist. As such, the atoms of the first and second barrier layers 120 and 170 need not diffuse into copper layer 150. As such, sheet resistance of the copper wire 10 may be reduced.

Copper Cu elements included in the first and second barrier layers 120 and/or 170 may increase the conductivity of the metal wire 10. A thin film transistor, which may be used in a conventional display device, may include aluminum or aluminum alloy as a gate wire and data wire materials. For example, aluminum-molybdenum (Al—Mo) or aluminum-titanium (Al—Ti) alloy may be used.

As the size of display devices increases and the gate wire or the data wires become longer and thinner and thereby the resistance may gradually increase, RC delay may increase. To reduce the resistance of a multi-layer metal wire 10 (e.g., the gate wire and/or the data wire), materials having relatively low resistance, such as copper (Cu) and/or silver (Ag), may be used instead of aluminum (Al). Copper, for example, may have relatively high electricity conductivity.

Nickel (Ni) elements included in the first and second barrier layers 120 and 170 may reduce chemical resistance, reduce corrosion, and increase peel strength of the first and second barrier layers 120 and 170. The peel strength between the substrate 11 and the metal wire 10 may be increased by the nickel (Ni) elements. The peel strength between the metal wire 10 and the insulating layer may be increased according to exemplary embodiments of the present invention. According to exemplary embodiments of the present invention, excessive etching of the metal wire 10 during the etching process may be reduced or prevented through the chemical resistance.

Zinc (Zn) elements included in the first and second barrier layers 120 and 170 may adjust the etching rate of the first and second barrier layers 120 and 170. Thus, the profile accuracy of the metal wire 10 may be increased by adjusting the etching rate by adjusting the ratio of Zinc (Zn) which is included in the first and second barrier layers 120 and 170. The profile accuracy of the metal wire 10 may be increased and the sheet resistance of the metal wire 10 may be reduced by adjusting the Cu:Ni:Zn content of the first and second barrier layers 120 and 170.

In the metal wire 10, the first barrier layer 120 may include copper at 40 weight % to 60 weight %, nickel at 20 weight % to 40 weight %, and zinc at 20 weight % to 40 weight %.

In the metal wire 10, the second barrier layer 170 may include copper at 20 weight % to 40 weight %, nickel at 20 weight % to 40 weight %, and zinc at 20 weight % to 60 weight %.

If nickel (Ni) elements of the first and second barrier layers 120 and 170 are 20 weight % or less, the peel strength of the metal wire 10 may be reduced. If the nickel (Ni) elements of the first and second barrier layers are 60 weight % or more, etching accuracy might be reduced due to chemical resistance and corrosion resistance.

The amount of copper (Cu) elements included in the first barrier layer 120 and the second barrier layer 170 may be varied to adjust the etching rate. If the amount of copper (Cu) elements included in the first and second barrier layers 120 and 170 is 20 weight % or less, the sheet resistance of the metal wire 10 may increase. If the amount of the copper (Cu) elements included in the first and second barrier layers 120 and 170 is 60 weight % or more, the amount of other elements may be reduced, and thus it may be difficult to adjust the peel strength and the etching rate of the metal wire 10.

The amount of Zinc (Zn) elements included in the first and second barrier layers 120 and 170 may vary. If the amount of the zinc (Zn) elements included in the first and second barrier layers 120 and 170 is 20 weight % or less, it may be difficult to perform the etching process because the etching rate may be excessively low. If the amount of Zinc (Zn) elements included in the first and second barrier layers 120 and 170 is 60 weight % or more, etching of the side surface of the metal wire 10 might not be uniform.

When the metal wire 10 is etched by adjusting the amount of the zinc (Zn) elements of the first and second barrier layers 120 and 170, if a relatively low amount of zinc (Zn) or a relatively high amount of zinc (Zn) is included in the first and second barrier layers 120 and 170, there may be downward skew or an upward skew, respectively, in the size of the upper part of the zinc layer 150. Thus, a taper angle of the metal wire 10 may be relatively large, and thus the sheet resistance of the metal wire 10 may be reduced. The taper angle may refer to the angles of side surfaces on the basis of a central line in the metal wire 10.

Figure 3:
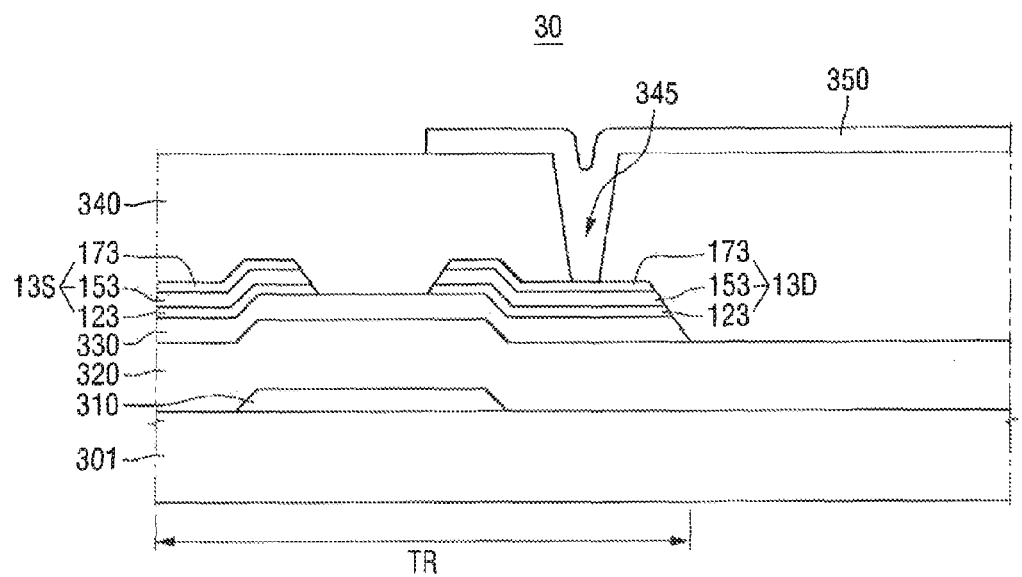
FIG. 3 is a cross-sectional view illustrating a liquid crystal display panel which includes a metal wire according to an exemplary embodiment of the present invention.

FIG. 3 is a cross-sectional view illustrating a liquid crystal display panel which includes a metal wire according to an exemplary embodiment of the present invention. The metal wire included in the liquid crystal display panel illustrated in the cross-sectional view in FIG. 3 is also described with reference to FIGS. 1A, 1B, 1C, 2A and 2B.

A liquid crystal display panel 30, which is included in the display device, may be a switching device for driving each pixel area, and may include a thin film transistor, a signal wire and a pixel electrode which are connected to the thin film transistor. The signal wire may include a gate wire which transmits the gate driving signal, and a data wire which transmits a data driving signal while crossing the gate wire.

As the size and resolution of display devices increase, the degree of integration and the number of functions of the signal wire may increase. As such, the area occupied by the metal wire 10 (e.g., the gate wire and the data wire) in the display device may be relatively large, and thus a multi-layer wire structure may be formed to reduce the area occupied by the metal wire 10 and increase reliability of the metal wire 10.

Referring to FIG. 3, in the liquid crystal display panel 30, the gate wire and the data wire may cross on a substrate 301, and a thin film transistor TR may be disposed on the crossed area. A gate electrode 310, which may be projected from the gate wire and may be integrally formed with the gate wire, may be disposed on the thin film transistor TR. A source electrode 13S, which may be integrally formed with the data wire, and a drain electrode 13D, which may be spaced apart from the source electrode 12S by a predetermined distance, may be disposed on the thin film transistor TR. The gate electrode 310 and/or the source/drain electrodes 13S and 13D may be formed as a metal wire including a first barrier layer 123, a copper layer 153, and a second barrier layer 173. According to an exemplary embodiment of the present invention, the source/drain electrodes 13S and 13D may be formed as the metal including a first barrier layer 123, a copper layer 153, and a second barrier layer 173.

A gate insulating layer 320 may be disposed on substantially an entire surface of the substrate 301. For example, the gate insulating layer 320 may be disposed over where the gate electrode 310 is disposed.

A semiconductor layer 330 may be disposed on the gate insulating layer 320. The semiconductor layer 330 may be an oxide semiconductor layer. The semiconductor layer 330 may refer to an oxide semiconductor layer 330. The oxide semiconductor layer 330 may include zinc, indium, gallium, tin, titanium, phosphorous oxide, or a combination thereof. For example, the oxide semiconductor layer 330 may include, ZnO, ZTO, ZIO, InO, TiO, IGZO, and/or IZTO. The oxide semiconductor layer 330 may include In—Ga—Zn—Oxide (IGZO).

The source/drain electrodes 13S and 13D may be disposed on the oxide semiconductor layer 330. The first barrier layer 123 of the source/drain electrodes 13S and 13D may be in contact with the oxide semiconductor layer 330. The copper layer 153 may be disposed on the first barrier layer 123, and the second barrier layer 173 may be disposed on the copper layer 153. The first barrier layer 123 may be disposed between the copper layer 153 and the oxide semiconductor layer 330.

When the copper layer 153 is in contact with the oxide semiconductor layer 330, diffusion may occur between materials, such as oxygen elements, of the oxide semiconductor layer 330 and the copper elements of the copper layer 153. The diffusion may increase the resistance of the metal wire including source/drain electrodes 13S and 13D. As such the increase of the resistance of the source/drain electrodes 13S and 13D may be reduced or prevented by reducing or preventing the diffusion between the materials of the oxide semiconductor layer 330 and the copper elements of the copper layer 153 by disposing the first barrier layer 123 between the copper layer 153 and the oxide semiconductor layer 330.

Copper (Cu) elements of the copper layer 153 have relatively low peel strength with a glass and/or an insulating layer which may be included in the substrate 301, and a reaction between the copper (Cu) elements and silicon or oxygen elements may occur. Thus, the peel strength of the copper layer 153 may be increased by forming the first barrier layer 123 as an adhesion layer before forming copper layer 153.

A passivation layer 340 may be disposed on substantially an entire surface of the substrate 301. For example, the passivation layer 340 may be disposed on substantially an entire surface of the source/drain electrodes 13S and 13D. A contact hole 345 may be disposed in the passivation layer 340. The drain electrode 13D may be connected with a pixel electrode 350 through the contact hole 345 so as to form the liquid crystal display panel 30.

The passivation layer 340 may include a silicon based material. For example, the passivation layer 340 may include SiO2 or SiNx. Materials may be exchanged between the silicon-based materials and the copper layer 153, and thus the material diffusion between the passivation layer 340 and the copper layer 153 may be reduced or prevented by disposing the second barrier layer 173 between the passivation layer 340 and the copper layer 153.

The liquid crystal display panel 30 may include the thin film transistor TR coupled to a color filter substrate and a liquid crystal layer may be disposed between the thin film transistor TR and the color filter substrate.

As described with reference to FIGS. 2A and 2B, the source/drain electrodes 13S and 13D may have a relatively low resistance, which may be determined by adjusting the Cu:Ni:Zn content in the metal wire.

A Cu—Mo or Cu—Ti alloy of a dual or 3-layer structure, which includes a bonding layer, has been used as the metal wire structure of display devices which include copper.

However, a copper layer/titanium layer may have a disadvantage that etching is not performed if there is no fluorine ion available due to chemical due to chemical interactions between fluorine and titanium. If the fluorine ion is contained in the etching solution including fluorine ions, such as hydrofluoric acid, the substrate and various silicon layers (e.g., the passivation layer including the semiconductor layer and the silicon nitride layer) might also be etched, and thus an error may occur in the fabrication process.

In addition, it may be difficult to store etching solutions such as hydrofluoric acid at room temperature and there may be a limit in the number of substrates which can be processed as the etchant.

According to an exemplary embodiment of the present invention, the semiconductor layer 330 may be an oxide and the titanium Ti elements might not be included in the metal wire (e.g., the source/drain electrodes 13S and 13D), and thus the etching may be performed without using the etchant based on the hydrofluoric acid. Thus, the etching process may be performed without the insulating layer being etched by the hydrofluoric acid.

Diffusion of materials between the copper layer 153 and the oxide semiconductor layer 330 may be reduced or prevented by the first barrier layer 123 disposed between the semiconductor layer 330 and the copper layer 153, and thus the electrical conductivity may be increased by lowering the resistance of the source/drain electrodes 13S and 13D. Thus, the response speed of the liquid display panel 30 may be increased.

Figure 4:
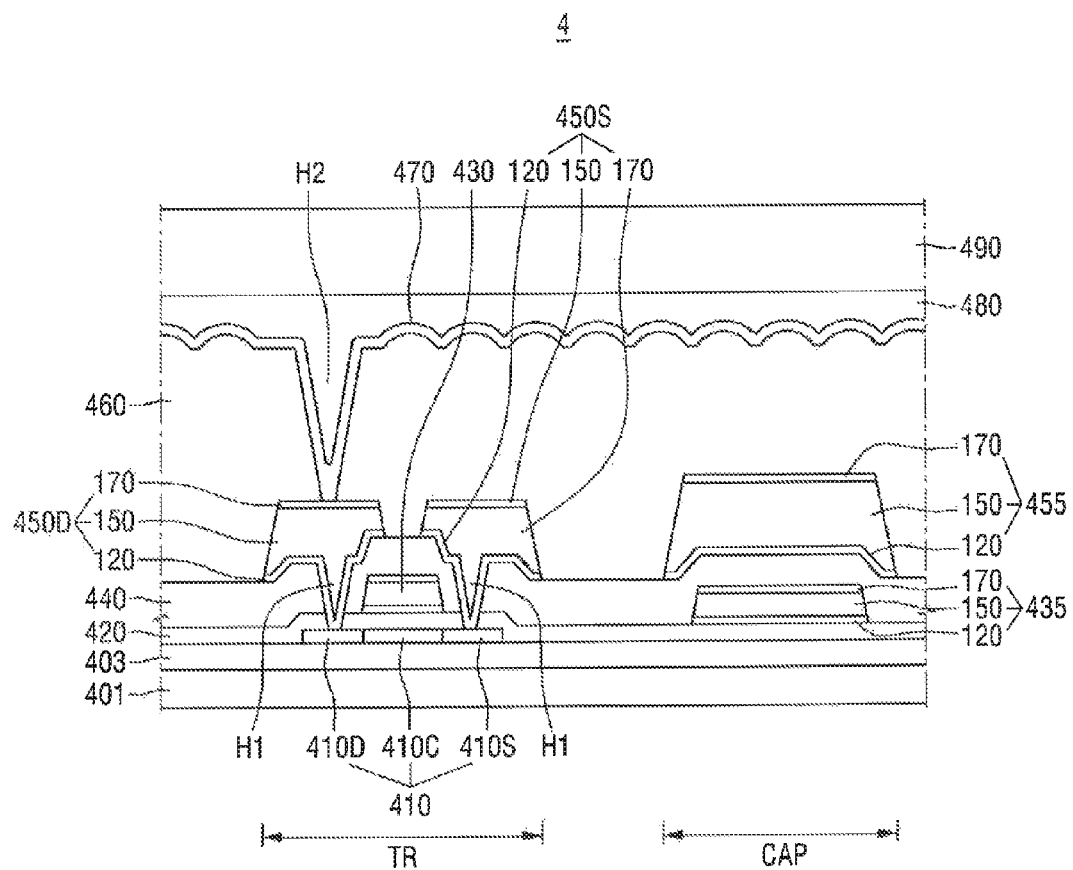
FIG. 4 is a cross-sectional view illustrating an organic light emitting display panel according to an exemplary embodiment of the present invention.

FIG. 4 is a cross-sectional view illustrating an organic light emitting display panel according to an exemplary embodiment of the present invention. The organic light emitting display panel may include the metal wire described with reference to FIGS. 1A, 1B, 1C, 2A and 2B. The metal wire illustrated in FIG. 1A will be described as a representative example.

Referring to FIG. 4, in an organic light emitting display panel 4 and a buffer layer 403 may be selectively disposed on a substrate 401. The substrate 401 may include a transistor area TR on which a thin film transistor is disposed and a capacitor area CAP on which a capacitor is disposed.

A semiconductor layer 410 may be disposed on the buffer layer 403. The semiconductor layer 410 may include amorphous silicon and/or polycrystalline silicon. The semiconductor layer 410 may be disposed on the transistor area TR. A first insulating layer 420, which may insulate the semiconductor layer 410, may be disposed on substantially an entire surface of the substrate 401. The first insulating layer 420 may be disposed on the semiconductor layer 410. A gate electrode 430 may be disposed on the transistor area TR. The gate electrode 430 may be disposed on the first insulating layer 420. A doping process may be performed on the semiconductor layer 410 by using the gate electrode 430 as a mask. A source area 410S and a drain area 410D may be formed on the semiconductor layer 410 by the doping process, and an active area 410C may be disposed between the source area 410S and the drain area 410D.

The gate electrode 430 may be disposed on the transistor area TR. A capacitor lower electrode 435 may be disposed on the capacitor area CAP.

A second insulating layer 440 may be disposed on substantially the entire surface of the substrate 401 where the gate electrode 430 and the capacitor lower electrode 435 are disposed. The second insulating layer 440 may include $SiO_2$ or SiNx.

In the gate electrode 430, the first barrier layer 120 may be disposed on a surface of the gate electrode 430 which is in contact with the first insulating layer 420, and the copper layer 150 may be disposed on the first barrier layer 120. The second barrier layer 170 may be disposed on the copper layer 150 so that the second barrier layer 170 is in contact with the second insulating layer 440.

The first barrier layer 120 may increase the adhesion between the gate electrode 430 and the first insulating layer 420 and may reduce or prevent the increase of the resistance of the gate electrode 430 by preventing silicon-based material diffusion. The second barrier layer 170 may be disposed between the copper layer 150 and the second insulating layer 440 so that material diffusion between the second insulating layer 440 and the copper layer 150 may be reduced or prevented.

A first penetration hole H1 may be disposed in the second insulating layer 440 of the transistor area TR. The first penetration hole H1 may penetrate the second insulating layer 440 and the first insulating layer 420 and may expose the source area 410S and the drain area 410D of the semiconductor layer 410. The source electrode 450S, which may be connected to the source area 410S, and the drain electrode 450D, which may be connected to the drain area 410D, may be disposed on the second insulating layer 440 including the first penetration hole H1. A capacitor upper electrode 455, which may be formed simultaneously with the source/drain electrodes 450S and 450D, may be disposed on the capacitor area CAP.

A third insulating layer 460 may be disposed on substantially the entire surface of the second insulating layer 440 where the source/drain electrodes 450S and 450D and the capacitor upper electrode 455 are disposed. A second penetration hole H2 may be disposed in the third insulating layer 460. The second penetration hole H2 may expose the source electrode 450S. The pixel electrode 470 may be disposed on the third insulating layer 460 including the second penetration hole H2. The pixel electrode 470 may include ITO which may be a transparent, conductive material.

The source/drain electrodes 450S and 450D may be disposed in the source/drain areas 410S and 410D. The first barrier layer 120 may be in contact with the first and second insulating layers 420 and 440. The copper layer 150 may be disposed on the first barrier layer 120. The first barrier layer 120 may increase the adhesion between the first insulating layer 420 and the copper layer 150, and may prevent the diffusion of the silicon-based materials included in the first insulating layer 420 to the copper layer 150 so as to reduce or prevent the increase of the resistance of the gate electrode 430.

The second barrier layer 170 may be disposed on the copper layer 150. The second barrier layer 170 may be connected to the pixel electrode 470 through the second penetration hole H2. The second barrier layer 170 may prevent the increase of the resistance of the source/drain electrodes 450S and 450D by preventing the diffusion of oxygen elements included in the pixel electrode 470, which may include ITO, into the copper layer 150.

An organic light emitting layer 480 may be disposed on the pixel electrode 470 and a counter electrode 490 may be disposed on the organic light emitting layer 480 to form the organic light emitting display panel 4.

The second barrier layer 170 may be disposed between the pixel electrode 470 and the copper layer 150, and thereby the material diffusion between the copper layer 150 and the pixel electrode 470 may be reduced or prevented. Thus, the increase of the resistance of the source/drain electrodes 450S and 450D may be reduced or prevented, and thereby the electric conductivity may be increased. Thus, the response speed of the organic light emitting display panel 4 may be increased.

Hereinafter, the metal wire according to an exemplary embodiment of the present invention will be described in more detail with reference to the drawings including the taper angle and the sheet resistance characteristics of the metal wire.

Preparation of Samples of a Metal Wire (a) Referring to FIG. 1A, the metal wire structure 1 may be formed by forming the first barrier layer 120 having a thickness of about 500 Å by a plasma enhanced chemical vapor deposition (PECVD) method. The first barrier layer 120 may be formed on the substrate 11. The copper layer 150 may be formed having a thickness of about 3000 Å by a sputtering method. The copper layer 150 may be formed on the first barrier layer 120. The metal wire 10 may be formed by forming the second barrier layer 170 having a thickness of about 500 Å by a plasma chemical vapor evaporation method. The second barrier layer 170 may be formed on the copper layer 150.

(b) Referring to FIG. 1B, the metal wire structure 2 may be formed by forming the copper layer 150-2 having a thickness of about 3000 Å on the substrate 11 by the sputtering method. The metal wire 10-2 may be formed by forming the second barrier layer 170-2 having a thickness of about 500 Å on the copper layer 150 by the plasma chemical vapor evaporation method.

(c) Referring to FIG. 1C, the metal wire structure 3 may be formed by forming the first barrier layer 120-3 having a thickness of about 500 Å on the substrate 11 by the plasma chemical vapor evaporation method. The metal wire 10-3 may be formed by forming the copper layer 150-3 having a thickness of about 3000 Å on the first barrier layer 120-3 by the sputtering method.

Hereinafter, the sample disclosed in (a) may be referred to as sample (a), the sample disclosed in (b) may be referred to as sample (b), and the sample disclosed in (c) may be referred to as sample (c).

In samples (a), (b), and (c), the second barrier layer 170 may include copper (Cu) at 47 weight %, nickel (Ni) at 33 weight %, and zinc (Zn) at 20 weight %, and the first barrier layer 120 may form metal wires 10, 10-2, and 10-3 including copper (Cu) at 47 weight %, nickel (Ni) at 33 weight %, and zinc (Zn) at 20 weight %.

The metal wire structures 1, 2, and 3 may be respectively prepared on the substrate 11 by cutting metal wire structures 1, 2, and 3 as pieces of 5 cm (width)×5 cm (length) including metal wires 10, 10-2 and 10-3.

Preparation of Etchant

Non-$H_2O_2$-based etchants may be prepared. For example, a non-$H_2O_2$-based etchant may be prepared including $H_3PO_4$ at 50 weight %, $HNO_3$ at 10 weight %, $CH_3COOH$ at 10 weight %, nitric salt at 10 weight %, acetate at 5 weight %, and a copper ion compound in deionized water making up the remaining weight %.

Alternatively, $H_2O_2$-based etchants are prepared. For example, an $H_2O_2$-based etchant may be prepared including $H_3PO_4$ at 50 weight %, $HNO_3$ at 10 weight %, $CH_3COOH$ at 10 weight %, nitric salt at 10 weight %, acetate at 5 weight %, hydrofluoric acid metal acid at 1 weight %, and a copper ion compound in deionized water making up the remaining weight %.

Measuring Taper Angle and Skew of a Metal Wire

Etching may be performed by providing respectively prepared etchants in metal wire structures 1, 2, and 3 including prepared metal wires 10, 10-2, and 10-3.

FIGS. 5A to 5F are cross-sectional views illustrating a taper angle θ and upper/lower skews (US, LS) of the metal wire after etching the metal wire according to an exemplary embodiment of the present invention.

A photoresist layer 500 covering part of the metal wire may be formed on the metal wires before providing the etchant. The taper angle θ and upper/lower skews (US, LS) may be measured by respectively providing the non-$H_2O_2$-based etchant and the $H_2O_2$-based etchant. A cross-section of the metal wire may be photographed with a focus ion beam (FIB) to measure the taper angle θ and the upper/lower skews (US, LS) of the metal wire.

Figure 5A:
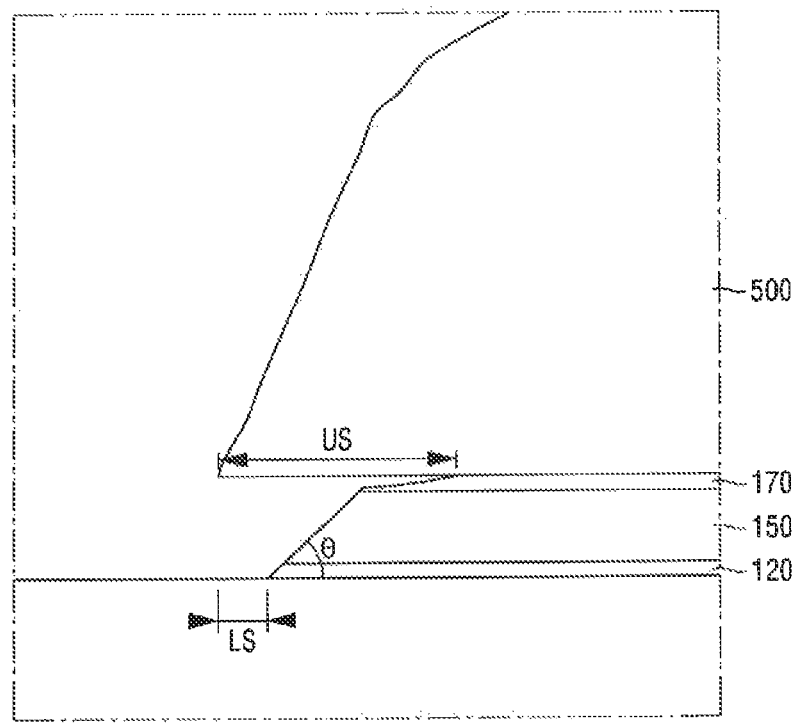
FIGS. 5A to 5F are cross-sectional views illustrating a taper angle θ and upper/lower skews (US, LS) of the metal wire after etching the metal wire according to an exemplary embodiment of the present invention.
Figure 5B:
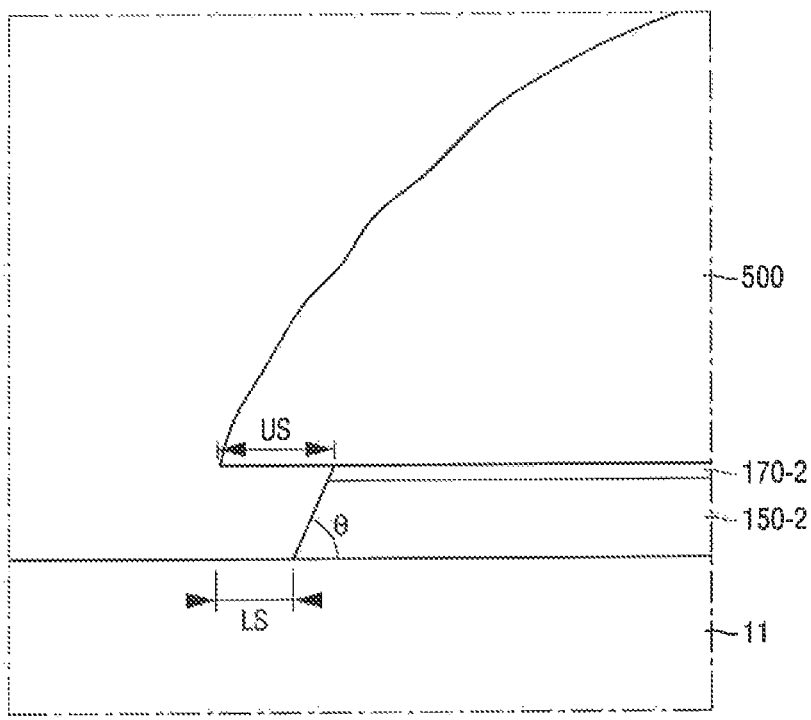
Figure 5C:
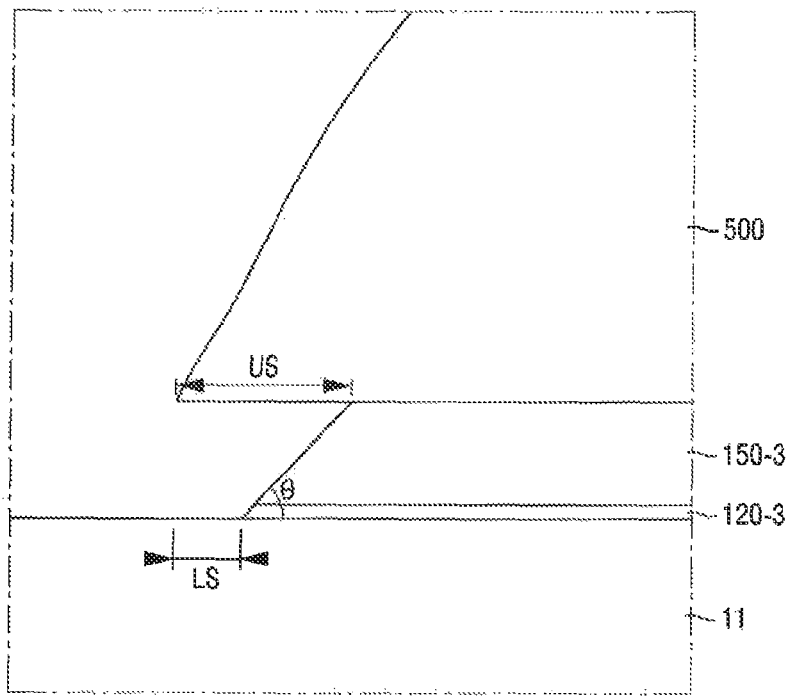

FIGS. 5A, 5B and 5C illustrate taper angles θ and upper/lower skews (US, LS) of the metal wire when providing the non-$H_2O_2$-based etchant, and Table 1 shows exemplary measurements of the taper angle θ and upper/lower skews (US, LS).

When using the non-$H_2O_2$-based etchant, the taper angle θ of the metal wires 10, 10-2, and 10-3 may be 39° or more, and upper/lower skews (US, LS) may be reduced.

According to an exemplary embodiment of the present invention, the metal wire 10 may be etched, and the upper skew US may be 781 nm, and the lower skew LS may be 140 nm. The taper angle θ may be 39.29°. A relatively larger amount of nickel (Ni) and copper (Cu) elements may be included in the first barrier layer 120 than the second barrier layer 170, and thus it may be understood that the taper angle may be relatively smaller. The upper/lower skews (US, LS) may be reduced due to the non-$H_2O_2$-based etchant not including hydrofluoric ions.

According to an exemplary embodiment of the present invention, the metal wire 10-2 may be etched so that the upper skew US is 303 nm and the lower skew LS is 216 nm. The taper angle θ may be 58.17°. According to an exemplary embodiment of the present invention, in the metal wire 10-2, the upper skew may be lower than in the metal wires 10 and 10-3, and the taper angle θ may be larger than in the metal wires 10 and 10-3. The upper skew may be relatively low as the zinc (Zn) elements are adjusted in the second barrier layer 170-2.

According to an exemplary embodiment of the present invention, the metal wire 10-3 may be etched so that the upper skew is 456 nm and the lower skew is 205 nm. The taper angle θ may be 40.73°. A relatively large amount of nickel (Ni) elements may be included in the first barrier layer 120-3 so that the lower skew may be relatively low.

According to an exemplary embodiment of the present invention, when the metal wires 10, 10-2, and 10-3 are etched by using the non-$H_2O_2$-based etchant, the upper/lower skews may be relatively small so that a minute pattern may be formed. The non-$H_2O_2$-based etchant may be stored at room temperature.

TABLE 1

| | Upper skew(nm) | Lower skew(nm) | Taper angle(°) | Etchant |
|---|---|---|---|---|
| embodiment 1 | 781 | 140 | 39.29 | non-$H_2O_2$-based etchant |
| embodiment 2 | 303 | 216 | 58.17 | |
| embodiment 3 | 456 | 205 | 40.73 | |
| embodiment 4 | 1803 | 1015 | 29.86 | $H_2O_2$-based etchant |
| embodiment 5 | 1906 | 1152 | 17.70 | |
| embodiment 6 | 1673 | 1148 | 19.98 | |

Figure 5D:
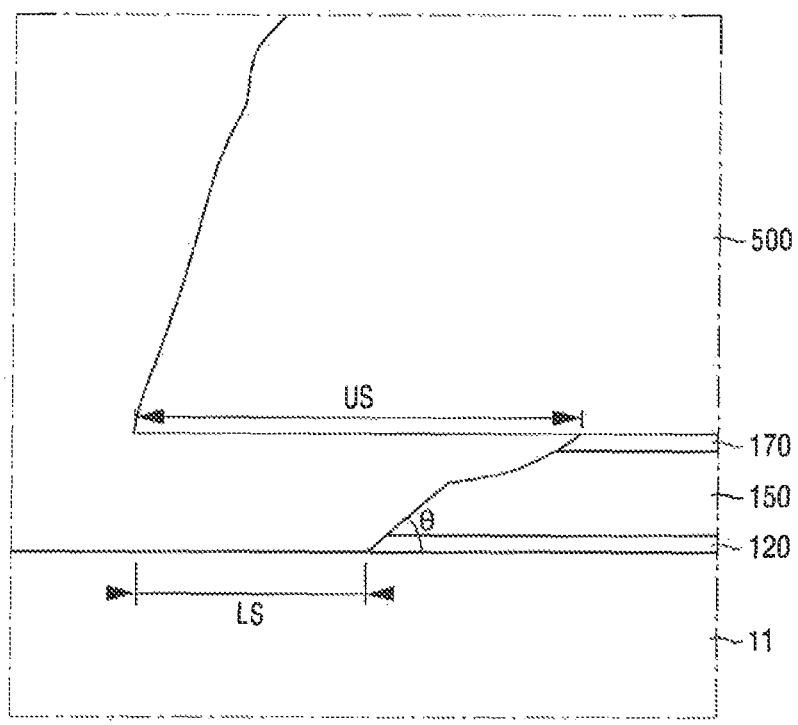
Figure 5E:
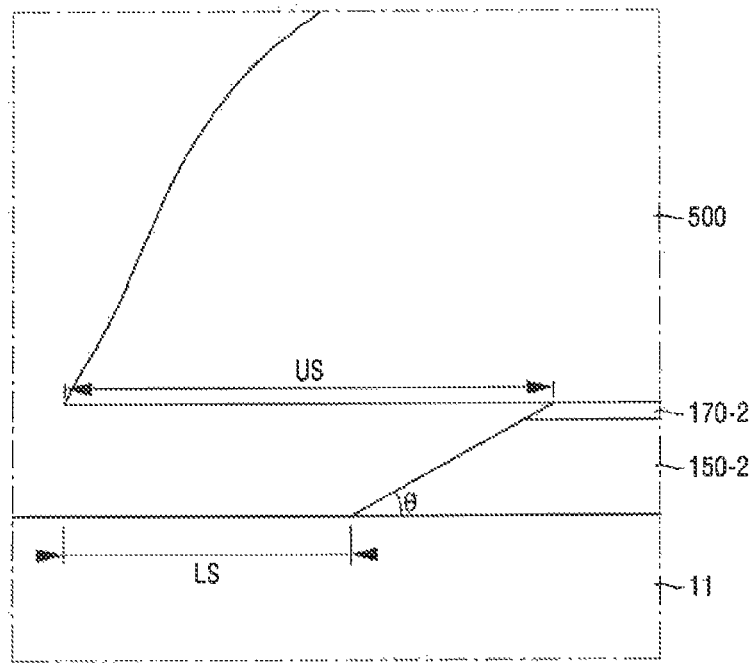
Figure 5F:
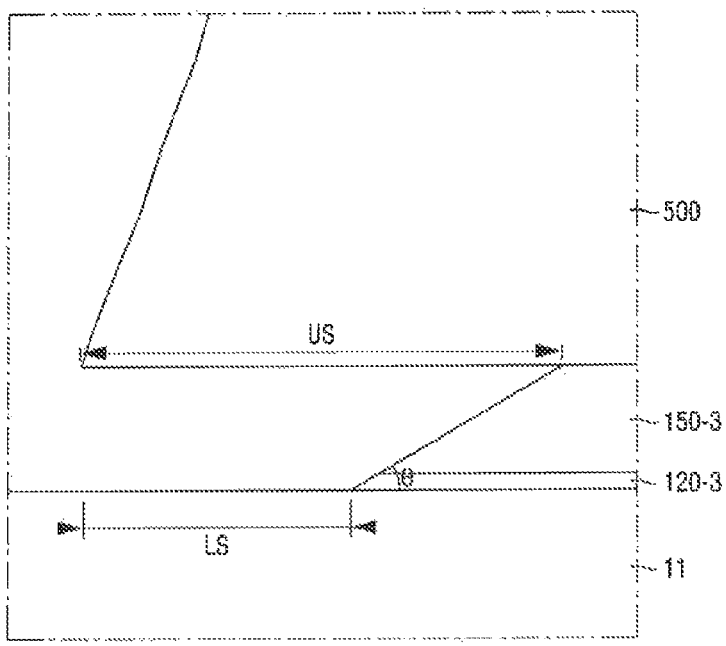

Referring to FIGS. 5D, 5E and 5F, the taper angle θ and upper/lower skews (US, LS) of the metal wire are illustrated according to providing $H_2O_2$-based etchants to samples (a), (b), and (c).

According to an exemplary embodiment of the present invention, the metal wire 10 may be etched so that the upper skew may be 1803 nm, and the lower skew LS may be 1015 nm. The taper angle may be 29.86°.

According to an exemplary embodiment of the present invention, the metal wire 10-2 may be etched so that the upper skew is 1906 nm, and the lower skew LS is 1152 nm. The taper angle θ may be 17.70°.

According to an exemplary embodiment of the present invention, the metal wire 10-3 may be etched so that the upper skew is 1673 nm and the lower skew is 1148 nm. The taper angle θ may be 19.98°.

In the metal wire according to exemplary embodiments of the present invention, the upper skew may be 800 nm or less. In the metal wire according to exemplary embodiments of the present invention, the upper skew may be 1500 nm or more.

The lower skew of the metal wire of according to exemplary embodiments of the present invention may be 250 nm or less. The lower skew of the metal wire according to exemplary embodiments of the present invention may be 1000 nm or more.

The taper angle of the metal wire according to exemplary embodiments of the present invention may be from about 30° to about 60°. The taper angle of the metal wire according to exemplary embodiments of the present invention may be from about 15° to about 30°.

According to exemplary embodiments of the present invention, the metal wires 10, 10-2, and 10-3 may be excessively etched due to $H_2O_2$-based etchants containing hydrofluoric ions.

When $H_2O_2$-based etchants are used at the time of etching the metal wires 10, 10-2, and 10-3, the upper and lower skews may be relatively large so that it may be difficult to form minute patterns (e.g., particular widths and/or thicknesses) of the metal wires 10, 10-2, and 10-3, and it may be difficult to form an etching profile having a uniform incline due to the excessive etching. Thus, an etching surface may be formed where an electric short circuit may occur.

Thin film layers may be stacked on a thin film transistor substrate. To prevent an electric short circuit, the shape of the cross-sectional side surface of the metal wire (e.g., the etching profile), may have a tapered shape in which the lower side is wider than the upper side while being uniformly inclined. After the etching process, there should be no small projections, which may be referred to as residues, on the surfaces of etched copper or other metal layers. That is, the etched surface should be substantially smooth.

That is, the etching of copper or other metals by the etchant might not be sufficient. The etched surface should be substantially smooth so that an electric short circuit does not occur. Thus, as in the exemplary embodiments of the present invention, the metal wires 10, 10-2, and 10-3 may be etched with the non-$H_2O_2$-based etchant.

In a metal wire which includes copper-molybdenum, fluorine ions do not need to be present, but control of the etching process may be reduced because different metals have different etching speeds.

According to exemplary embodiments of the present invention, a taper shape, in which the lower part is wider than the upper part while the etching profile is uniform, may be formed.

The metal wires 10, 10-2, and 10-3 according to exemplary embodiments of the present invention may include etched surfaces which are smooth without using $H_2O_2$-based etchants containing fluorine ions. Non-$H_2O_2$-based etchants may be used, and thus a short circuit, which may occur due to the etching of the substrate and various insulating layers using $H_2O_2$-based etchants may be reduced or prevented.

Measuring Sheet Resistance of Metal Wire 1

9 points may be designated as a probe which may be arranged at regular intervals on respective surfaces in the metal wire structures 1, 2, and 3 including prepared metal wires 10, 10-2, and 10-3, and the resistance values for each of the 9 points may be averaged so as to determine the sheet resistance of the metal wires 10, 10-2, and 10-3.

Figure 6:
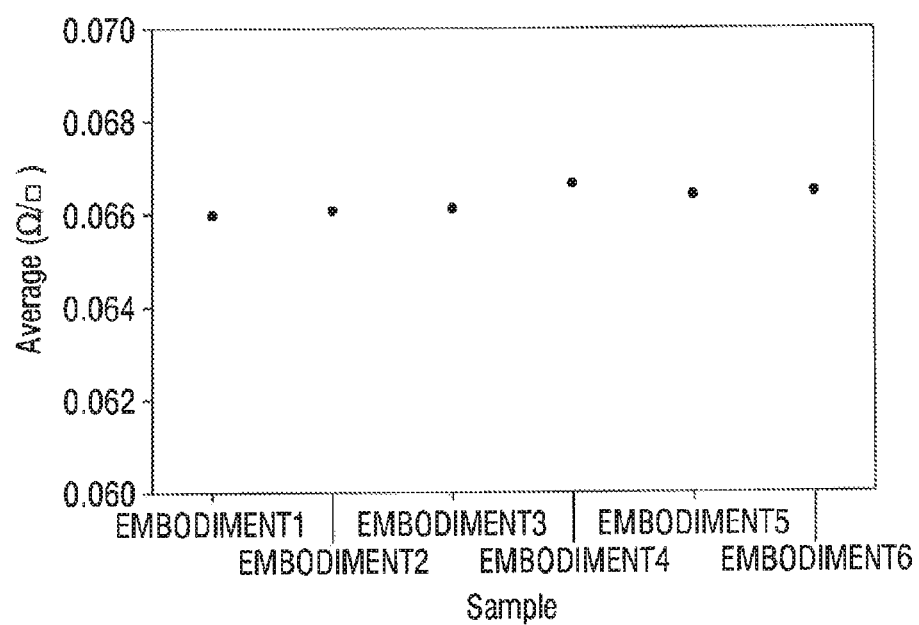
FIG. 6 is a graph illustrating uniformity of a sheet resistance of a metal wire before heat treatment according to an exemplary embodiment of the present invention.

FIG. 6 is a graph illustrating uniformity of a sheet resistance of a metal wire before heat treatment according to an exemplary embodiment of the present invention. Here, sample (a) includes first and fourth embodiments, sample (b) includes second and fifth embodiments, and sample (c) includes third and sixth embodiments. Sheet resistance may be measured by contacting 9 points with these samples. Table 2 illustrates the sheet resistance average and sheet resistance uniformity of the metal wires.

Referring to FIG. 6 and Table 2, the first embodiment shows the use of non-$H_2O_2$-based etchants in sample (a) and the surface resistance averages may be 6.60E-02 ohm/sq. The fourth embodiment shows the use of $H_2O_2$-based etchants and the surface resistance averages may be 6.61E-02 ohm/sq.

The sheet resistance uniformity of the first embodiment may be 11.44%, and the sheet resistance uniformity of the fourth embodiment may be 11.86%.

The second embodiment shows the use of non-$H_2O_2$-based etchants in sample (b) and the surface resistance averages may be 6.61E-02 ohm/sq. The fifth embodiment shows the use of $H_2O_2$-based etchants in sample (b) and the surface resistance averages may be 6.66E-02 ohm/sq.

The sheet resistance uniformity of the second embodiment may be 10.13%, and the sheet resistance uniformity of the fifth embodiment may be 10.64%.

The third embodiment shows the use of non-$H_2O_2$-based etchants in sample (c) and the surface resistance averages may be 6.64E-02 ohm/sq. The sixth embodiment shows the use of $H_2O_2$-based etchants in sample (c) and the surface resistance averages may be 6.65E-02 ohm/sq.

The sheet resistance uniformity of the third embodiment may be 11.16%, and the sheet resistance uniformity of the sixth embodiment may be 11.23%.

Thus, in the first to sixth embodiments, the sheet resistance of the metal wires 10, 10-2, and 10-3 before heat treatment may be between 0.064 ohm/sq. and 0.068 ohm/sq.

TABLE 2

| Sample | Sheet resistance average (Rs average) | Sheet resistance uniformity (Rs uniformity) |
|---|---|---|
| embodiment 1 | 6.60E−02 | 11.44% |
| embodiment 4 | 6.61E−02 | 11.86% |
| embodiment 2 | 6.61E−02 | 10.13% |
| embodiment 5 | 6.66E−02 | 10.64% |
| embodiment 3 | 6.64E−02 | 11.16% |
| embodiment 6 | 6.65E−02 | 11.23% |

The etching of the metal wires 10, 10-2, and 10-3 may be evenly performed regardless of the etchant due to the material characteristics of the first and second barrier layers 120 and 170 including copper (Cu), nickel (Ni) and Zinc (Zn). When considering that the sheet resistance uniformity may be 15% or less, it may be understood that the etched surface of the metal wires 10, 10-2, and 10-3 may be relatively smooth without an occurrence of a hillock in which the sheet resistance may be increased.

Measuring the Sheet Resistance of the Metal Wire 2

9 points may be designated as a probe which may be arranged at regular intervals on respective surfaces in the metal wire structures 1, 2, and 3 including prepared metal wires 10, 10-2, and 10-3, and the resistance values for the 9 points may be averaged so as to determine the sheet resistance of the metal wires 10, 10-2, and 10-3.

Sample (a) of the first embodiment, sample (b) of the second embodiment, and sample (c) of the third embodiment may be heat-treated at 350° C., and the sheet resistance of the heat-treated samples may be determined.

Figure 7:
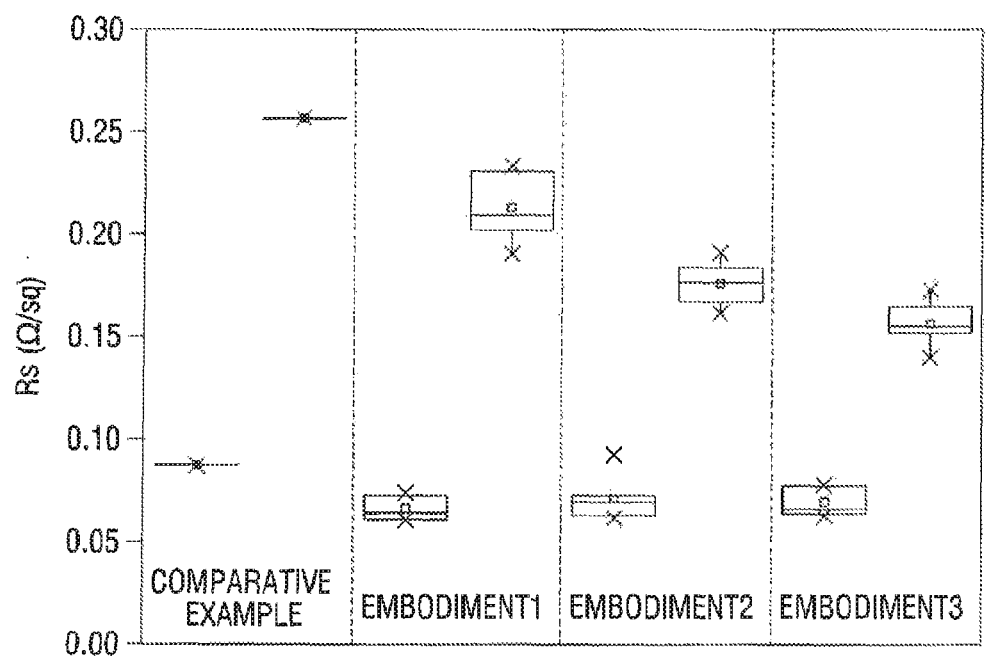
FIG. 7 is a graph illustrating a sheet resistance of a metal wire before and after heat treatment according to an exemplary embodiment of the present invention.

FIG. 7 is a graph illustrating a sheet resistance of a metal wire before and after heat treatment according to an exemplary embodiment of the present invention. The metal wire including Titanium/copper (Ti/Cu) may be used as a comparative example, and the sheet resistances of first to third exemplary embodiments of the present invention may be compared.

Table 3 is a table showing sheet resistances of the metal wire before and after heat treatment.

TABLE 3

| Sample | Sheet resistance before heat treatment | Sheet resistance after heat treatment |
| --- | --- | --- |
| Comparative example | 8.89E-02 | 25.67E-02 |
| embodiment 1 | 6.60E-02 | 21.53E-02 |
| embodiment 2 | 6.61E-02 | 17.88E-02 |
| embodiment 3 | 6.64E-02 | 15.64E-02 |

Referring to FIG. 7 and Table 3, the sheet resistance before heat treatment of the metal wire in the comparative example may be 8.89E-02 ohm/sq., and the sheet resistance after heat treatment may be 25.67E-02 ohm/sq.

In the metal wire of the first embodiment, the sheet resistance before heat treatment may be 6.60E-02 ohm/sq., and the sheet resistance after heat treatment may be 21.53E-02 ohm/sq.

In the metal wire of the second embodiment, the sheet resistance before heat treatment may be 6.610E-02 ohm/sq., and the sheet resistance after heat treatment may be 17.88E-02 ohm/sq.

In the metal wire of the third embodiment, the sheet resistance before heat treatment may be 6.64E-02 ohm/sq., and the sheet resistance after heat treatment may be 15.64E-02 ohm/sq.

Thus, in first to third embodiments, the sheet resistances of metal wires 10, 10-2, and 10-3 after heat treatment may be between 0.15 ohm/sq. and 0.25 ohm/sq.

As in the comparative example, in the copper elements of the copper layer 150 and the titanium elements of the barrier layer, diffusion between materials may occur during the heat treatment process, and thus the sheet resistance of the metal wire of the comparative example may increase.

In the first to third embodiments, the sheet resistance increase rate may be reduced by 20 to 25% compared to the comparative example. According to exemplary embodiments of the present invention, the inter-material diffusion probability between the first and second barrier layers 120 and 170 may be reduced, and thus the sheet resistance increase rate may be reduced. The atom radiuses of copper (Cu), nickel (Ni) and zinc (Zn) elements, which may be included in the barrier layers according to exemplary embodiments of the present invention, may be similar to each other, and thus material exchange may be reduced or prevented and thereby inter-material diffusion may be reduced or prevented.

Measuring Adhesive Characteristics of Metal Wires

After cutting the metal wire structures 1, 2, and 3 to have about a 10 mm width and about a 100 mm length, the peel strength of 30 mm lengths of the metal wires may be evaluated with the speed of 50.8 mm/min by using a Z050 universal testing machine (UTM) (e.g., manufactured by Zwick company, Kennesaw, Ga.). Table 4 illustrates exemplary peel strengths.

TABLE 4

| Sample | Peel strength, Kgf/cm |
| --- | --- |
| embodiment 1 | 0.51 |
| embodiment 2 | 0.45 |
| embodiment 3 | 0.58 |

Metal wires 10, 10-2, and 10-3 may have peel strengths of 0.40 Kgf/cm and thus the metal wires 10, 10-2, and 10-3 need not be separated from the substrate or the insulating layer. Metal wires according to exemplary embodiments of the present invention may be disposed on the substrate or the insulating layer, and the peel strength between the substrate and the insulating layer may be 0.40 Kgf/cm or more.

Nickel (Ni) elements, which may be included in the first and second barrier layers 120 and 170, may increase the peel strength with the substrate or the insulating layer, and thus the peel strength of the first and second barrier layers 120 and 170 may be increased.

The first and second barrier layers 120 and 170 may be disposed on the upper and lower parts of the copper layer 150. The first and second barrier layers 120 and 170 may include an alloy including copper (Cu), nickel (Ni) and zinc (Zn) elements. Thus, the metal wires 10, 10-2, and 10-3 may be formed, and etching may be performed using the non-$H_2O_2$-based etchant, and the accuracy of the taper angle may be increased and the upper skew may be reduced.

Even when the metal wires according to exemplary embodiments of the present invention are heat-treated, inter-material diffusion may be reduced or prevented by the material characteristics of the first and second barrier layers, and thereby the sheet resistance may be reduced. By increasing the peel strength between the layers of the metal wires according to exemplary embodiments of the present invention, the accuracy and resolution of the colors of the metal wire structure and the display panel using the same may be increased.

Metal wires according to exemplary embodiments of the present invention may reduce or prevent metal diffusion between a substrate or insulating layer and a copper layer, and the metal wires may have a relatively low sheet resistance While the invention has been particularly shown and described with reference to exemplary embodiments thereof, it will be understood by those of ordinary skill in the art that various changes in provide form and detail may be made therein without departing from the spirit and scope of the present invention.

What is claimed is:

1. A metal wire comprising:
a copper layer;
a first barrier layer disposed on a lower surface of the copper layer; and
a second barrier layer disposed on an upper surface of the copper layer, wherein a thickness of at least one of the first and second barrier layers is from 50 Å to 600 Å, wherein each of the first and second barrier layers comprises an alloy including copper, nickel, and zinc, and wherein a zinc content of the first barrier layer is different from a zinc content of the second barrier layer.

2. The metal wire of claim 1, wherein at least one of the first and second barrier layers includes copper at 20 weight % to 60 weight %, nickel at 20 weight % to 40 weight %, and zinc at 20 weight % to 40 weight %.

3. The metal wire of claim 1, wherein at least one of the first and second barrier layers includes copper at 20 weight % to 40 weight %, nickel at 20 weight % to 40 weight %, and zinc at 20 weight % to 60 weight %.

4. The metal wire of claim 1, wherein the zinc content of the second barrier layer is higher than the zinc content of the first barrier layer.

5. The metal wire of claim 1, wherein the copper layer has a thickness of from 2500 Å to 3500 Å.

6. The metal wire of claim 1, wherein the metal wire comprises a taper angle of from 30° to 60°.

7. The metal wire of claim 1, wherein the metal wire is etched with a non-$H_2O_2$-based etchant.

8. The metal wire of claim 1, wherein an upper skew of the metal wire is 800 nm or less.

9. The metal wire of claim 1, wherein a lower skew of the metal wire is 250 nm or less.

10. The metal wire of claim 1, wherein a sheet resistance of the metal wire before heat treatment is from 0.064 ohm/sq. to 0.068 ohm/sq.

11. The metal wire of claim 1, wherein a sheet resistance of the metal wire after heat treatment is from 0.15 ohm/sq. to 0.25 ohm/sq.

12. A display device comprising:
a thin film transistor disposed on a substrate in an area where a gate wire and a data wire cross each other;
a semiconductor layer disposed on the thin film transistor;
an insulating layer configured to insulate the gate wire and the data wire; and
a pixel electrode connected to the data wire,
wherein the gate wire and the data wire comprise a copper layer and a first barrier layer, wherein the first barrier layer is disposed on a lower part of the copper layer, wherein the first barrier layer includes copper, nickel, and zinc, and wherein the first barrier layer includes copper at 20 weight % to 60 weight %, nickel at 20 weight % to 40 weight %, and zinc at 20 weight % to 40 weight %,
wherein the gate wire and the data wire comprise a second barrier layer, wherein the second barrier layer is disposed on an upper part of the copper layer, wherein the second barrier layer includes copper, nickel, and zinc, and wherein the second barrier layer includes copper at 20 weight % to 60 weight %, nickel at 20 weight % to 40 weight %, and zinc at 20 weight % to 60 weight %, and
wherein a zinc content of the first barrier layer is different from a zinc content of the second barrier layer.

13. The display device of claim 12, wherein the semiconductor layer or the pixel electrode include a material comprising oxygen elements.

14. The display device of claim 12, wherein the zinc content of the second barrier layer is higher than the zinc content of the first barrier layer.

* * * * *